(12) United States Patent
Ohmori

(10) Patent No.: US 6,586,345 B1
(45) Date of Patent: Jul. 1, 2003

(54) METHOD OF MANUFACTURING A SEMICONDUCTOR DEVICE WIRING LAYER HAVING AN OXIDE LAYER BETWEEN THE POLYSILICON AND SILICIDE LAYERS

(75) Inventor: Toshiaki Ohmori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/133,404

(22) Filed: Aug. 13, 1998

(30) Foreign Application Priority Data

Feb. 23, 1998 (JP) ............................. 10-040551

(51) Int. Cl.[7] ................. H01L 21/31; H01L 21/469
(52) U.S. Cl. ................ 438/770; 438/655; 438/787; 438/790
(58) Field of Search .................. 438/592, 635, 438/769–770, 787, 789–790, 655, 657

(56) References Cited

U.S. PATENT DOCUMENTS

| | | | | |
|---|---|---|---|---|
| 5,023,679 A | * | 6/1991 | Shibata .................. 257/344 |
| 5,326,406 A | * | 7/1994 | Kaneko et al. .............. 134/1 |
| 5,474,949 A | | 12/1995 | Hirao et al. | |
| 5,502,315 A | * | 3/1996 | Chua et al. ................ 257/50 |
| 5,576,579 A | * | 11/1996 | Agnello et al. ........... 257/751 |
| 5,581,092 A | * | 12/1996 | Takemura .................. 257/65 |
| 5,650,339 A | * | 7/1997 | Saito et al. ............... 438/164 |
| 5,665,647 A | * | 9/1997 | Ishigami .................. 438/664 |
| 5,744,845 A | * | 4/1998 | Sayama et al. ............ 257/371 |
| 5,818,092 A | * | 10/1998 | Bai et al. .................. 257/388 |
| 5,876,796 A | * | 3/1999 | Regolini et al. ........ 427/255.17 |
| 5,943,592 A | * | 8/1999 | Tsukamoto et al. ......... 438/486 |
| 6,194,296 B1 | * | 2/2001 | Lien ....................... 438/592 |
| 6,372,662 B1 | * | 4/2002 | Smith et al. .............. 438/255 |

FOREIGN PATENT DOCUMENTS

| | | |
|---|---|---|
| DE | 4228679 A1 | 8/1992 |
| EP | 0860863 A2 * | 8/1998 |
| JP | 1-287963 | 11/1989 |
| JP | 4-34926 | 2/1992 |
| JP | 4-114431 | 4/1992 |
| JP | 5-74751 | 3/1993 |
| JP | 8-250727 | 9/1996 |
| JP | 08-250727 | 9/1998 |

* cited by examiner

*Primary Examiner*—Carl Whitehead, Jr.
*Assistant Examiner*—Jamie L. Brophy
(74) *Attorney, Agent, or Firm*—McDermott, Will & Emery

(57) ABSTRACT

In forming a conduction film in a semiconductor device, after an uneven natural oxide film on a silicon film has been once removed, an even and clean silicon oxide film is formed by an oxidizing chemical solution treatment. After that, a silicide film is formed, thus forming a stable conduction film consisting of a two-layered structure of a polysilicon/silicide film.

7 Claims, 5 Drawing Sheets

METHOD OF MANUFACTURING A SEMICONDUCTOR DEVICE WIRING LAYER HAVING AN OXIDE LAYER BETWEEN THE POLYSILICON AND SILICIDE LAYERS

TECHNICAL FIELD

The present invention relates to a semiconductor device and a manufacturing method thereof, and more particularly to an improved wiring structure in a semiconductor device and a manufacturing method thereof.

BACKGROUND ART

In a semiconductor device, a tungsten silicide film or a titanium silicide film is used as an electrode material or an interconnection material.

For example, FIG. 6 shows a structure of a MOS transistor. A pair of high concentration impurity regions 1a are formed on a silicon substrate 1. A gate oxide film 2 is formed on a channel region 1b sandwiched between the impurity regions 1a, and a gate electrode is further formed thereon. Employed as the gate electrode is a two-layered film structure which consists of an impurity-containing polysilicon film 3 and a silicide film 5 (the tungsten silicide film or the titanium silicide film) formed on the polysilicon film 3.

Also, employed in FIG. 7, for example, as a wiring structure for making contact with a silicon substrate 1 is a two-layered film structure which, in much the same way as in FIG. 6, consists of a polysilicon film 3 and a silicide film 5 formed on the polysilicon film 3.

When such a two-layered film structure undergoes a high temperature heat treatment at about 800° C., and if the two-layered film interface is of an unstable structure, then silicon in the polysilicon film or the silicide film aggregates at the interface, which bring about a discontinuity of the film in quality and the thickness. As a result, the problems will arise such as an increase in wiring resistance or a patterning irregularity.

For instance, Japanese Patent Laid-Open No. Hei 8-250727 discloses a method for solving such problems, in which, as shown in FIG. 8, a titanium oxide-containing titanium silicide film 5a is interposed between a polysilicon film 3 and a titanium silicide film 5. Formation of the titanium oxide-containing titanium silicide film 5a has been described as follows. First, in an oxidizing atmosphere, a heat treatment of the polysilicon film 3 oxidizes the surface thereof. Then, a thermal reaction is carried out between the oxidized surface and the titanium silicide film 5 formed thereon, thus the titanium oxide-containing titanium silicide film 5a is formed.

Japanese Patent Laid-Open No. Hei 1-287963 discloses a method in which a metal oxide film is interposed between a polysilicon film and a silicide film. The processing steps are shown in FIG. 9, and formation of the metal oxide film has been described as follows. First, a gate oxide film 2 is formed on a silicon substrate 1 (FIG. 9(a)). Second, by leaving in an atmosphere a polysilicon film 3 formed thereon, a natural oxide film 7 is formed on the surface thereof (FIG. 9(b)). Then, a metal 8 (for example Ti), which has higher oxidation reaction heat than the silicon oxide film, is thinly formed, and a silicide film 5 is formed thereon further (FIG. 9(c)). Finally, by heat treatment, a reaction will occur between the natural oxide film 7 and the metal film 8, and a metal oxide film 10 (TiOx) is formed at the interface between the polysilicon film and the silicide film (FIG. 9(d)). It is shown that the patterning thereof is made thereafter (FIG. 9(e)).

In both of the prior art, a thin oxide film is, first of all, formed on a polysilicon film surface. A method of forming the oxide film is classified into a method of performing a heat treatment in an oxidizing atmosphere and a method of leaving in an atmosphere. The former finds it difficult to uniformly form a relatively thin film, and at the same time has a problem of increasing the number of the processing steps. Also, the latter takes a time to form a certain quantity of oxide film and finds it difficult to control a thickness of the oxide film, and what is more, gives rise to a worry about contamination from the atmosphere.

DISCLOSURE OF THE INVENTION

The present invention has been made in view of the above-mentioned circumstances, and it is an object of the present invention to provide a method of forming, easily and with an excellent controllability, a thin and clean oxide film on a polysilicon film surface in order to form a stable interface in a two-layered film structure which consists of a polysilicon film and a silicide film formed thereon.

Furthermore, the present invention not only makes it possible to form a conduction film of stable characteristics but also provides a semiconductor device in which the conduction film is used and a manufacturing method thereof.

According to one aspect of the present invention, in a method of manufacturing a semiconductor device, a silicon film is formed in a semiconductor wafer. A thin film of a silicon oxide is formed on the silicon film by means of a treatment with an oxidizing chemical. A silicide film is formed on the thin film of the silicon oxide.

Further, in the method, after the silicon film is formed but before the thin film of the silicon oxide film is formed, an oxide film formed naturally on a surface of the silicon film is removed.

In the method, the oxidizing chemical is preferably one kind of oxidizing chemical, a mixed chemical of two kinds or more of oxidizing chemicals, or a mixed chemical of an oxidizing chemical and a non-oxidizing chemical.

In the method, the one kind of oxidizing chemical is preferably a sulfuric acid solution, a nitric acid solution, a hydrogen peroxide, or an ozone water.

In the method, the mixed chemical of two kinds or more of oxidizing chemicals is preferably a mixed chemical of a sulfuric acid solution and a hydrogen peroxide, or a mixed chemical of a sulfuric acid solution and an ozone water.

In the method, the mixed chemical of an oxidizing chemical and a non-oxidizing chemical is preferably a mixed chemical of a hydrogen peroxide and a hydrochloric acid solution or an ammonia solution, or a mixed chemical of an ozone water and a hydrochloric acid solution or an ammonia solution.

In the method, the thin film of the silicon oxide film is preferably formed to be 200 Å or less in thickness.

Other and further objects, features and advantages of the invention will appear more fully from the following description.

BEST MODE FOR CARRYING OUT THE INVENTION

First Embodiment

Figure 1A:
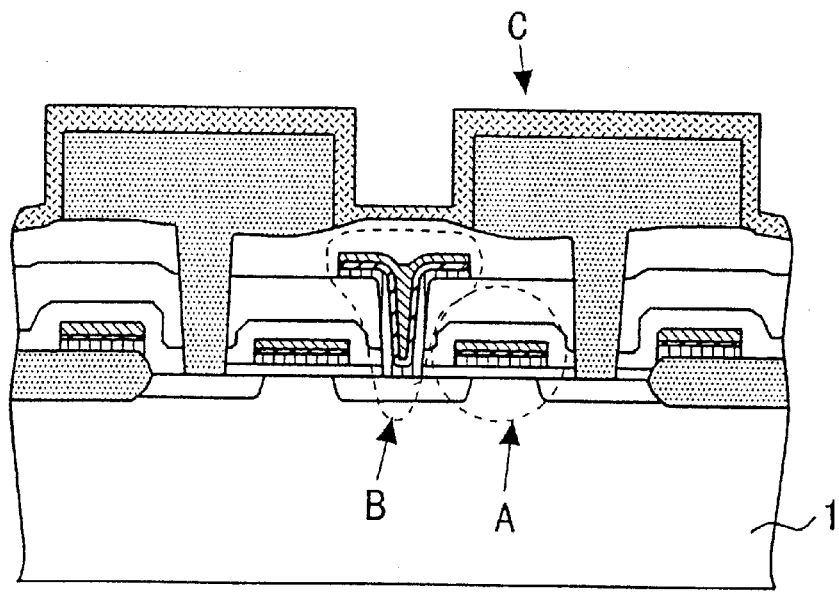
FIGS. 1(a), 1(b) and 1(c) are cross sectional structural views of a semiconductor device according to an embodiment of carrying out the present invention.
Figure 1B:
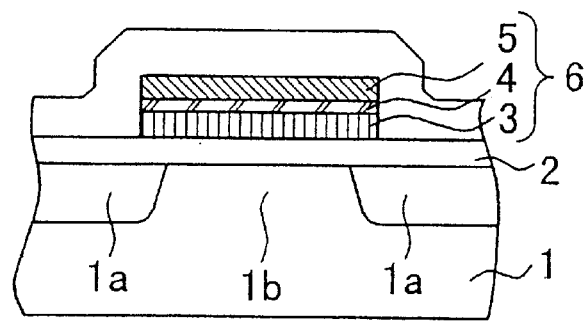
Figure 1C:
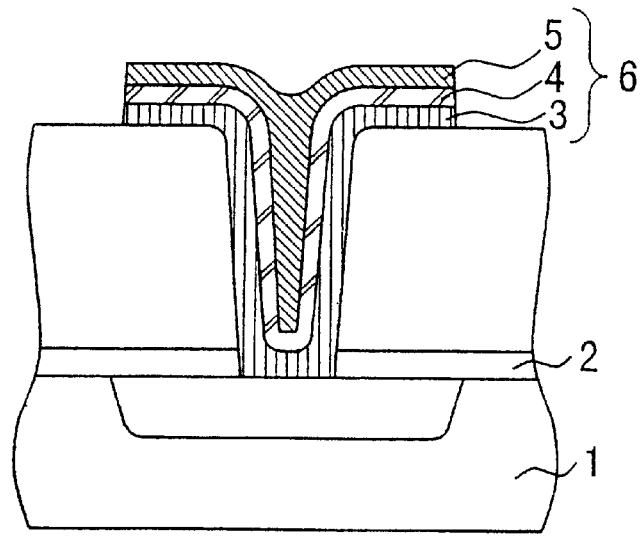

FIGS. 1(a) through 1(c) are cross sectional views showing a structure of a semiconductor device according to one embodiment of the present invention. FIGS. 2(a) through 2(f) are cross sectional views showing a process of forming the semiconductor device in FIGS. 1(a) through 1(c), which is, concretely speaking, a method of forming a conduction film.

FIG. 1(a) is, concretely speaking, a cross sectional view showing an essential part of a memory cell unit in a semiconductor memory device. In the semiconductor device, a MOS transistor for memory is formed in a portion indicated by a circle A on a semiconductor substrate 1. A word line is formed in a portion indicated by a circle B. Capacitor is formed at a portion indicated by an arrow C.

FIG. 1(b) is a cross sectional view showing a structure of the MOS transistor indicated by the circle A in FIG. 1(a). As shown in the Figure, the structure of the MOS transistor is as follows. The MOS transistor comprises conduction film 6 as a gate electrode on a gate insulating film 2 formed on source and drain regions 1a on a semiconductor substrate 1. The conduction film 6 is formed in a two-layered conduction film structure which consists of a polysilicon film 3, a thin chemical oxide film 4, and a silicide film 5. Incidentally, if considering the chemical oxide film 4 to be one layer, the conduction film 6 becomes a three-layered structure. The characteristic of the conduction film 6 is that it is formed with the thin chemical oxide film 4 sandwiched therein.

FIG. 1(c) is a cross sectional view showing the word line indicated by the circle B in FIG. 1(a). A conduction film 6 as the word line is also formed in a two-layered conduction film structure which consists of a polysilicon film 3, a chemical oxide film 4, and a silicide film 5. The characteristic of the conduction film 6 is that it is also formed with the thin chemical oxide film 4 sandwiched therein.

FIGS. 2(a) through 2(f) are cross sectional views showing a process for forming the conduction film 6 shown in FIGS. 1(a) through 1(c).

Referring to FIGS. 2(a) through 2(f), the description will be given below concerning the process flow.

Figure 2A:
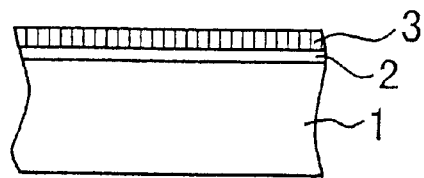
FIGS. 2(a) through 2(f) are cross sectional views showing a process flow chart for describing a method of forming the semiconductor device according to the embodiment of carrying out the present invention.
Figure 2B:
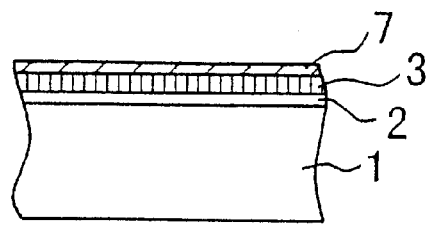

First, as shown in FIG. 2(a), the gate oxide film 2 is formed on the semiconductor substrate 1. Then, the polysilicon film 3 is formed on the gate oxide film 2, using a CVD method. On the surface of the polysilicon film 3 thus formed, as shown in FIG. 2(b), an uneven and non-uniform natural oxide film 7 is formed. This phenomenon results when the wafer is moved out of the CVD furnace into the atmosphere and left in an atmosphere.

Figure 2C:
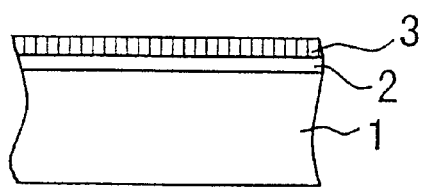

Then, as shown in FIG. 2(c), the natural oxide film 7 is once removed at a cleaning step. Concretely, the natural oxide film 7 on the surface of the polysilicon film 3 is removed by using a hydrofluoric acid solution diluted with pure water (for example, an order of 5 wt % 0.1 wt %). A solution to be used may be a solution other than the hydrofluoric acid, such as buffered hydrofluoric acid (a mixed solution made by mixing the hydrofluoric acid with ammonium fluoride), as long as it is capable of etching an oxide film.

Figure 2D:
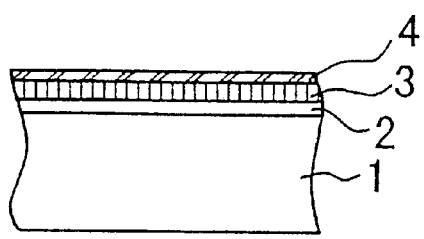

Then, as shown in FIG. 2(d), an even and clean chemical oxide film (natural oxide film) 4 is newly formed continuously.

In this step is, that is after the natural oxide film 7 has been once eliminated as described above, the polysilicon film 3 is treated by means of an oxidizing chemical. Thereby, an even and clean chemical oxide film 4 may be formed on the surface of the polysilicon film 3 as shown in FIG. 2(d).

Employed as the oxidizing chemical may be any of the followings. (1) one kind of chemical having an oxidizing property, (2) a mixed chemical made by suitably mixing two kinds or more of chemicals having an oxidizing property, or (3) a mixed chemical made by suitably mixing a chemical of an oxidizing property with a chemical of a non-oxidizing property.

Typical chemicals and the corresponding conditions are as follows.

First, as (1) the one kind of chemical having an oxidizing property, the examples mentioned below are preferable:

(a) a sulfuric acid solution heated at an order of 80 to 130° C. (80 to 98 wt %)

(b) a nitric acid solution heated at an order of room temperature to 90° C. (60 to 70 wt %)

(c) an ozone water (5 to 20 ppm)

(d) a hydrogen peroxide solution heated at an order of room temperature to 80° C. (30 wt %).

Next, as (2) the mixed chemical made by suitably mixing two kinds or more of chemicals having an oxidizing property, the examples mentioned below are preferable:

(e) a mixed solution of a sulfuric acid solution and a hydrogen peroxide solution, which is heated at an order of 80 to 130° C. (sulfuric acid concentration: 80 to 98 wt %, hydrogen peroxide solution concentration: 1 to 5 wt %)

(f) an ozone-containing sulfuric acid solution, into which an ozone gas is dissolved by means of a bubbling thereof and which is heated at an order of 80 to 130° C. (80 to 98 wt %).

Also, as (3) the mixed chemical made by suitably mixing a chemical of an oxidizing property with a chemical of a non-oxidizing property, the examples mentioned below are preferable:

(g) a mixed solution of a hydrochloric acid solution and a hydrogen peroxide solution, which is heated at an order of room temperature to 80° C. (hydrochloric acid concentration: 1 to 5 wt %, hydrogen peroxide solution concentration: 1 to 5 wt %)

(h) an ozone-containing hydrochloric acid solution, into which an ozone gas is dissolved by means of a bubbling thereof and which is heated at an order of room temperature to 80° C. (1 to 5 wt %)

(i) a mixed solution of an ammonia solution and a hydrogen peroxide solution, which is heated at an order of room temperature to 80° C. (ammonia concentration: 1 to 5 wt %, hydrogen peroxide solution concentration: 1 to 5 wt %)

(j) an ozone-containing ammonia solution, into which an ozone gas is dissolved by means of a bubbling thereof and which is heated at an order of room temperature to 80° C., and so on.

Other than the above-mentioned solutions, any solution is employable as long as it has an oxidizing ability.

Figure 3:
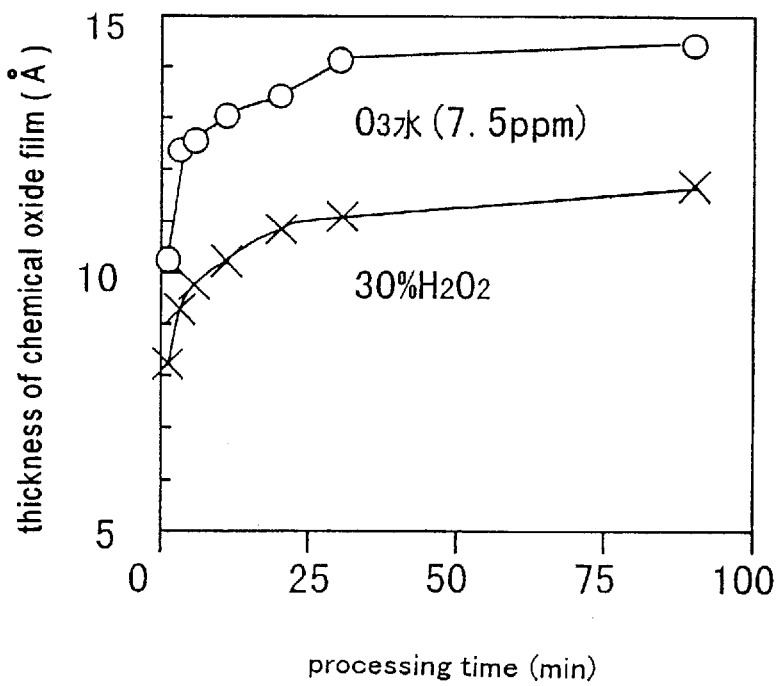
FIG. 3 is a diagram showing a growth state in thickness of a natural oxide film formed by an oxidizing chemical in the embodiment of carrying out the present invention.

FIG. 3 shows a result of measuring a film thickness of a chemical oxide film 4 formed on the Poly Si by employing an ozone water (7.5 ppm, 23° C.) and a hydrogen peroxide solution (30 wt %, 23° C.) as the oxidizing chemical. The result reveals that a formation of the chemical oxide film 4 is nearly completed in a processing time of 25 to 30 minutes.

Figure 4:
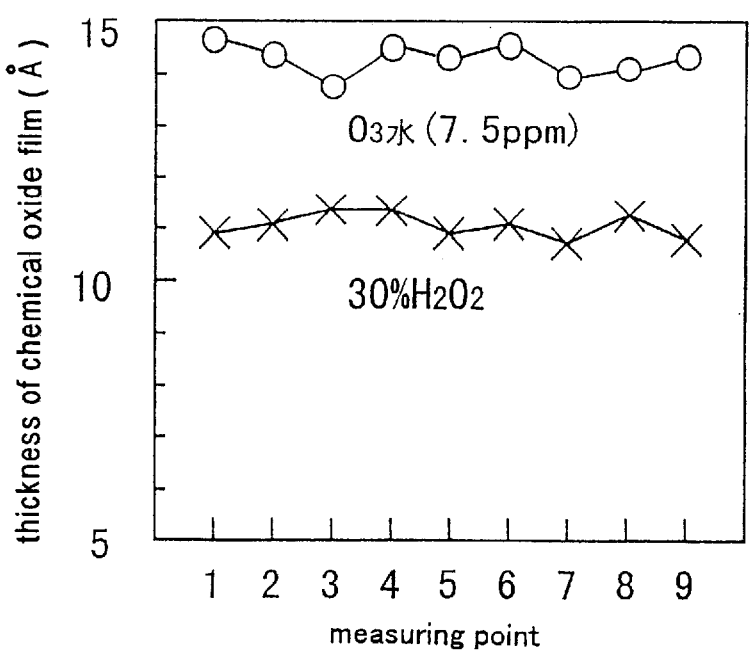
FIG. 4 is a diagram showing, within a wafer surface, an evenness and uniformity of the natural oxide film formed by an oxidizing solution in the embodiment of carrying out the present invention.

Regarding a chemical oxide film 4 formed on the Poly Si when the treatment is performed for, for example, 30 minutes by equally employing an ozone water (7.5 ppm, 23° C.) and a hydrogen peroxide solution (30 wt %, 23° C.) as an oxidizing chemical, FIG. 4 shows variations in the film thickness thereof at nine positions inside the wafer surface. The Figure reveals that the variations in the film thickness of the chemical oxide film 4 fall within ±1 angstrom (Å), and thus the chemical oxide film 4 formed is an even one.

The employment of such a solution as having an oxidizing property makes it possible to form, easily and conveniently, the even and thin chemical oxide film 4 (natural oxide film).

It is preferable that a film thickness of the chemical oxide film to be formed falls in a range of 5 Å to 50 Å. In particular, most preferably it has about 10 to 30 Å film thickness, but 100 Å or less would be preferable. The thickness of the chemical oxide film may be not greater than 200 Å. If the thickness exceeds 200 Å, the interface resistance between the polysilicon film 3 and the silicide film 5 may increase. Arbitrary adjustment of conditions, such as concentration of a solution used, the temperature or the processing time, makes it possible to control the film thickness of the chemical oxide film 4.

Also, an ultra pure water or a chemical, the impurity level of which is below ppb level, is used in a semiconductor manufacturing (cleaning) step. Employment of such a chemical as the chemical solution here makes it possible to form a clean chemical oxide film with an extremely little impurity contamination.

Figure 2E:
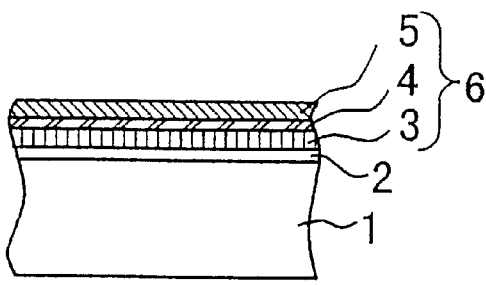

After the chemical oxide film 4 is formed on the polysilicon film 3 in accordance with the above-mentioned method, as shown in FIG. 2(e), a tungsten silicide film 5 is formed through a CVD method (550 to 600° C.) using, for example, WF6 or SiH2CL2 gas. Also, it is allowable that the silicide film 5 (a tungsten silicide film or a titanium silicide film) is formed by using a sputtering.

Figure 2F:
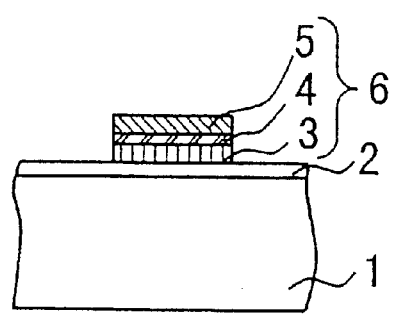

Next, after the silicide film 5 is formed, using a remaining resist as the mask, a patterning is performed by a dry etching as shown in FIG. 2(f), thus forming a wiring structure of the two-layered conduction film 6 consisting of the polysilicon film 3 and the silicide film 5.

Figure 5:
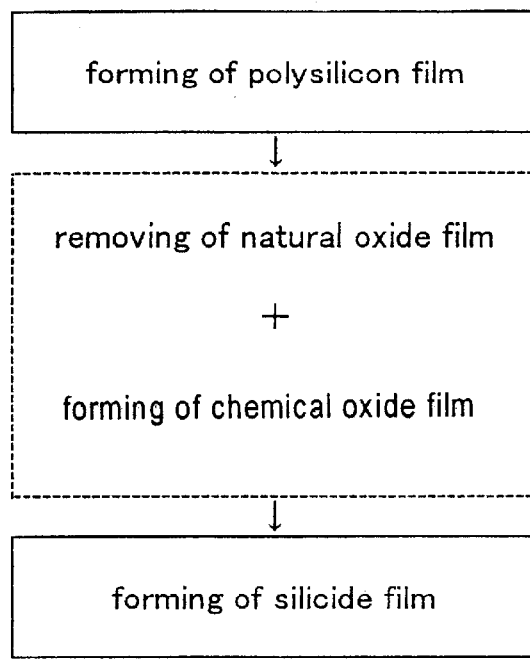
FIG. 5 is a conceptual view showing a method of forming the semiconductor device according to the embodiment of carrying out the present invention.
Figure 6:
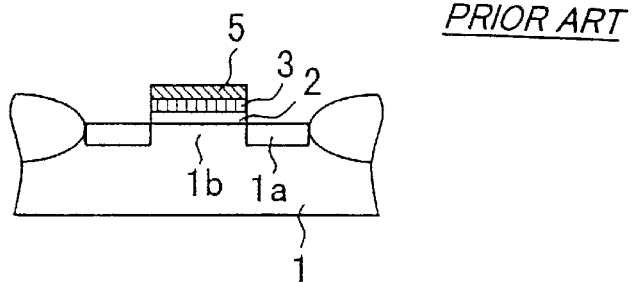
FIG. 6 is a cross sectional view of a conventional semiconductor device.
Figure 7:
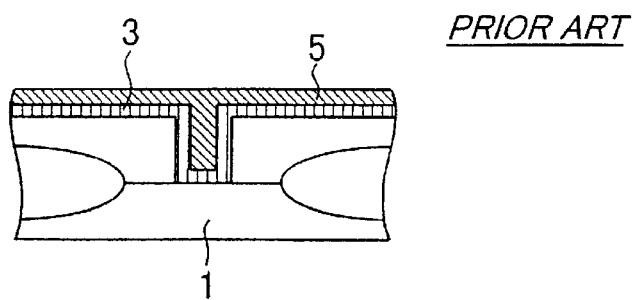
FIG. 7 is a cross sectional view of a conventional semiconductor device.
Figure 8:
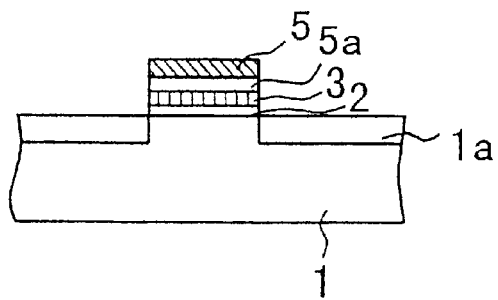
FIG. 8 is a cross sectional view of a conventional semiconductor device.
Figure 9A:
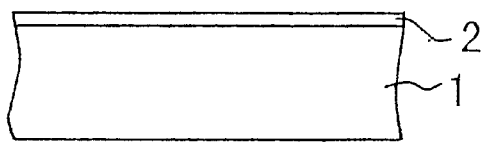
FIGS. 9(a) through 9(e) are cross sectional views in a manufacturing process of a conventional semiconductor device.
Figure 9B:
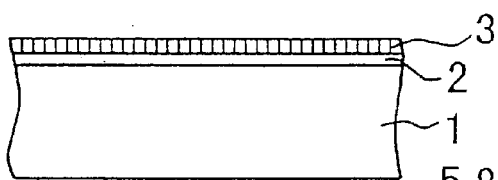
Figure 9C:
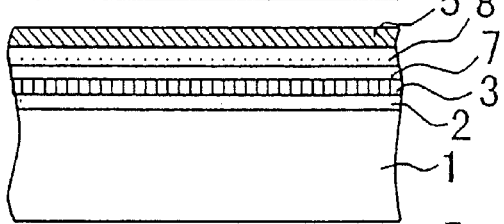
Figure 9D:
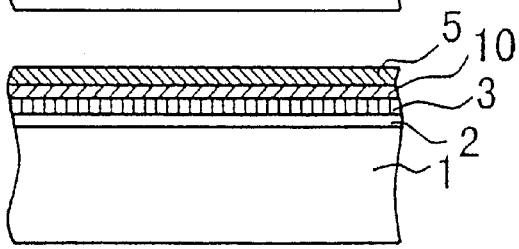
Figure 9E:
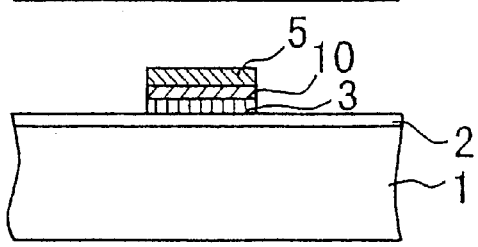

FIG. 5 shows the essence of the above-mentioned manufacturing method and is self expalnatory.

Incidentally, the polysilicon film explained above is equally applicable to other silicon films having an electrical conductivity, too.

As described above, the present invention, through a treatment of a polysilicon film surface with a chemical solution containing at least a chemical of an oxidizing property, makes it possible to form an even and clean chemical oxide film in a two-layered film structure of a polysilicon film/silicide film. This makes it possible not only to prevent silicon from aggregating at an interface of the polysilicon film/silicide film but also to prevent an occurrence of a patterning irregularity at the time of a patterning of the conduction film.

Also, the present invention allows a stable interface to be obtained even in the case of performing a high temperature heat treatment.

As described above, in the present invention, after a thin chemical oxide film is formed by performing a treatment of a polysilicon film surface with an oxidizing chemical, a silicide film is formed so as to form a two-layered conduction film structure of a polysilicon film/silicide film.

This makes it possible to form an interconnection in which there occurs no increase in resistance in the conduction film as well as to obtain a stable interface even in the case of performing a high temperature heat treatment, which also enhances yield in manufacturing semiconductor devices.

It is further understood that the foregoing description is a preferred embodiment of the disclosed device and that various changes and modifications may be made in the invention without departing from the spirit and scope thereof.

What is claimed is:

1. A method of manufacturing a semiconductor device comprising the steps of:

forming a silicon film on a semiconductor substrate; chemically treating said silicon film with an oxidizing chemical solution to form a thin silicon oxide film at a thickness of 200 Å or less thereon;

forming a silicide film directly on said thin silicon oxide film; and removing selectively said silicide film, thin silicon oxide film and silicon film to form a conducting film comprising said silicide film, thin silicon oxide film and silicon film.

2. The method of manufacturing a semiconductor device as claimed in claim 1, further comprising removing an oxide film formed naturally on the surface of said silicon film before forming the thin silicon oxide film.

3. The method of manufacturing a semiconductor device as claimed in claim 1, wherein said oxidizing chemical is selected from a group including one kind of oxidizing chemical, a mixed chemical of two kinds or more of oxidizing chemicals, and a mixed chemical of an oxidizing chemical and a non-oxidizing chemical.

4. The method of manufacturing a semiconductor device as claimed in claim 3, wherein said oxidizing chemical is selected from a group including a sulfuric acid solution, a nitric acid solution, a hydrogen peroxide, and an ozone water.

5. A method of manufacturing a semiconductor device comprising the steps of:

forming a silicon film on a semiconductor substrate;

chemically treating said silicon film with an oxidizing chemical solution to form a thin silicon oxide film thereon;

forming a silicide film directly on said thin silicon oxide film; and removing selectively said silicide film, thin silicon oxide film and silicon film to form a conducting film comprising said silicide film, thin silicon oxide film and silicon film, wherein said oxidizing chemical is selected from a group including a mixed chemical of a sulfuric acid solution and a hydrogen peroxide, and a mixed chemical of a sulfuric acid solution and an ozone water.

6. The method of manufacturing a semiconductor device as claimed in claim 3, wherein said oxidizing chemical is selected from a group of a mixed chemical of a hydrogen peroxide and a hydrochloric acid solution or an ammonia solution, and a mixed chemical of an ozone water and a hydrochloric acid solution or an ammonia solution.

7. A method of manufacturing a semiconductor device, the method comprising sequentially:

forming a silicon film on a semiconductor substrate;

removing an oxide film naturally formed on the surface of the silicon film;

treating the surface of the silicon film with an oxidizing chemical solution to form a thin silicon oxide film at a thickness of less than 200 Å thereon;

forming a silicide film directly on the thin silicon oxide film; and removing selectively said silicide film, thin silicon oxide film and silicon film to form a conducting film comprising said silicide film, thin silicon oxide film and silicon film;

wherein the oxidizing chemical is selected from the group consisting of a sulfuric acid solution, a nitric acid solution, a hydrogen peroxide, ozone water, a mixture of sulfuric acid solution with an ozonated water, a mixture of hydrogen peroxide and an ammonia solution, a mixture of an ozonated water and a hydrochloric acid solution and a mixture of ozonated water and an ammonia solution.

* * * * *